(12) United States Patent
Yamamoto et al.

(10) Patent No.: US 6,733,822 B2
(45) Date of Patent: May 11, 2004

(54) PROCESS FOR PRODUCING SINTERED ALUMINUM NITRIDE FURNISHED WITH VIA HOLE

(75) Inventors: Reo Yamamoto, Tokuyama (JP); Yoshihide Kamiyama, Tokuyama (JP)

(73) Assignee: Tokuyama Corporation (JP)

( * ) Notice: Subject to any disclaimer, the term of this patent is extended or adjusted under 35 U.S.C. 154(b) by 0 days.

(21) Appl. No.: 10/049,356

(22) PCT Filed: May 31, 2001

(86) PCT No.: PCT/JP01/04617

§ 371 (c)(1),
(2), (4) Date: Feb. 6, 2002

(87) PCT Pub. No.: WO01/94273

PCT Pub. Date: Dec. 13, 2001

(65) Prior Publication Data

US 2002/0160903 A1 Oct. 31, 2002

(30) Foreign Application Priority Data

Jun. 7, 2000 (JP) ........................................ 2000-170961

(51) Int. Cl.[7] .................................................. B05D 5/12
(52) U.S. Cl. .................... 427/97; 427/383.3; 427/383.5
(58) Field of Search ................................ 427/97, 383.3, 427/383.5

(56) References Cited

U.S. PATENT DOCUMENTS 6,475,924 B2 * 11/2002 Yamamoto et al. .......... 438/758

FOREIGN PATENT DOCUMENTS

| JP | 10107437 A | * | 4/1998 | ............ H05K/3/46 |
| JP | 2986596 B2 | * | 10/1999 | |
| JP | (1999) 2986596 B2 | | 10/1999 | |
| JP | (2000) 2000-290748 A | | 10/2000 | |

OTHER PUBLICATIONS

Patent Abstracts of Japan, Publication No. 10–107437, published Apr. 24, 1998, Inventors Hiroshi et al.
Patent Abstracts of Japan, Publication No. 08–088453, published Apr. 2, 1996, Inventors Hiroyasu et al.
Patent Abstracts of Japan, Publication No. 11–031881, published Feb. 2, 1999, Inventors Naito Akihiko et al.
Patent Abstracts of Japan, Publication No. 08–088451, published Apr. 2, 1996, Inventors Horiguchi Akihiro et al.

* cited by examiner

Primary Examiner—Brian K. Talbot
(74) Attorney, Agent, or Firm—Webb Ziesenheim Logsdon Orkin & Hanson, P.C.

(57) ABSTRACT

A sintered aluminum nitride having satisfactorily densified via holes, which is free from cracking and has an excellent appearance, is produced through firing an aluminum nitride molding having at least one highly isolated through-hole for via hole formation. At least one through-hole for formation of dummy via holes not used for electrical connection is formed around the highly isolated through-hole for via hole formation, and the through-hole for dummy via hole formation is also filled with a conductive paste. Thereafter, the aluminum nitride molding is fired into the sintered aluminum nitride.

10 Claims, 1 Drawing Sheet

PRIOR ART

US 6,733,822 B2

PROCESS FOR PRODUCING SINTERED ALUMINUM NITRIDE FURNISHED WITH VIA HOLE

BACKGROUND OF THE INVENTION

The present invention relates to a process for producing a sintered aluminum nitride furnished with via holes. More particularly, the present invention relates to a process for producing a crackless sintered aluminum nitride furnished with highly isolated via holes, having been satisfactorily densified.

The sintered aluminum nitride has excellent properties such as a high thermal conductivity, a favorable electrical insulation and a thermal expansion coefficient substantially equal to that of silicon (Si) for forming integrated circuits. Therefore, the sintered aluminum nitride is widely used as, for example, a substrate of semiconductor circuit components.

In particular, the sintered aluminum nitride having through-holes provided with internal conductive layers, known as via holes, is highly advantageously used because semiconductor external circuits can be electrically connected to each other through the via holes. With respect to the via holes formed in the sintered aluminum nitride, the arrangement, number, diameter, etc. thereof are determined variously in conformity with the design specification of desired substrate for semiconductor mounting.

As an advantageous method for furnishing the sintered aluminum nitride with via holes, there can be mentioned the co-firing method. The co-firing method comprises providing an aluminum nitride molding having through-holes for via hole formation, filling the through-holes for via hole formation with a conductive paste and firing the molding so as to simultaneously effect via hole firing and substrate sintering by one firing operation. This method enables producing the sintered aluminum nitride furnished with via holes efficiently through limited process steps, and is hence advantageous.

However, in the co-firing method, when the through-holes for via hole formation are highly isolated (that is, around one through-hole for via hole formation, other through-holes for via hole formation are not densely present), the influence of a shrinkage factor difference between conductive portions and sintered portions of aluminum nitride is so high around each of the highly isolated through-holes for via hole formation that a sintering balance is deteriorated. As a result, internal cracking of the sintered aluminum nitride and poor densification of via holes resulting in cracking of internal conductive portions and poor appearance have been experienced.

The resultant cracks tend to trap a gas, a liquid or impurities during the step of forming a thin film, for example, a thin film of conductive metal on a surface of the sintered product, and the expansion of trapped matter would cause film blisters. Further, dirt tends to stick to the sintered product surface, thereby inviting a decrease of film adhesion. Moreover, when a poor densification occurs at the above highly isolated via holes, the positional accuracy of via holes may be deteriorated.

Therefore, there has been a demand for the development of a process wherein the above problems would not occur even if an aluminum nitride molding having highly isolated through-holes for via hole formation is fired.

SUMMARY OF THE INVENTION

The inventors have made extensive and intensive studies with a view toward solving the above problems. As a result, it has been found that the above problems can be solved by furnishing an aluminum nitride molding with not only highly isolated through-holes for via hole formation but also through-holes for formation of dummy via holes not used for electrical connection. The present invention has been completed on the basis of this finding.

In particular, according to one aspect of the present invention, a process is provided for producing a sintered aluminum nitride furnished with via holes, comprising providing an aluminum nitride molding having through-holes for via hole formation and through-holes for formation of dummy via holes not used for electrical connection, filling the through-holes for via hole formation and the through-holes for dummy via hole formation with a conductive paste and firing the aluminum nitride molding and conductive paste.

In the above process, the aluminum nitride molding is furnished with the through-holes for via hole formation and the through-holes for dummy via hole formation so that the through-holes for via hole formation having been filled with the conductive paste and the aluminum nitride molding respectively exhibit a firing shrinkage factor ($X_v$, %) and a firing shrinkage factor ($X_s$, %) whose difference, ($X_v - X_s$,) is in the range of -1.0 to 9.5%.

In another aspect of the present invention, there is provided a process for producing a sintered aluminum nitride furnished with via holes as mentioned above, wherein at least one of the through-holes for via hole formation is in such a highly isolated state that, therearound, other through-holes for via hole formation are not densely present, and wherein at least one of the through-holes for dummy via hole formation is formed around the through-hole for via hole formation of said highly isolated state.

DETAILED DESCRIPTION OF THE INVENTION

Figure 1:
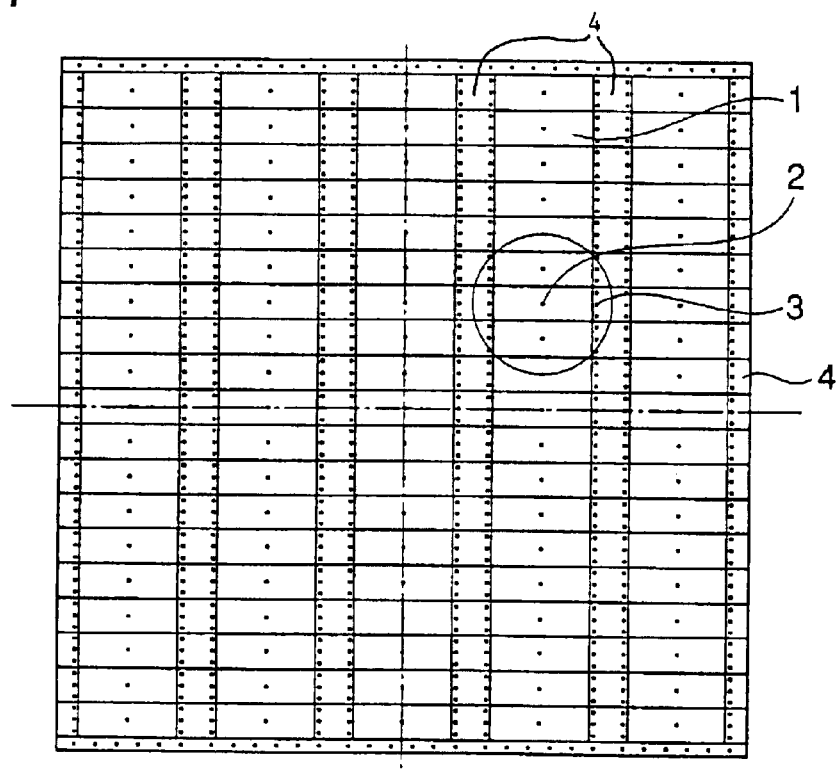
FIG. 1 is a plan of an aluminum nitride molding furnished with through-holes for via hole formation and through-holes for dummy via hole formation according to the present invention, wherein the circle shows a boundary defined by a radius of 5.0 mm from the center of a through-hole for via hole formation.

In the present invention, the aluminum nitride molding 1 is obtained by molding a composition comprising powdery aluminum nitride, a sintering aid and organic ingredients such as an organic binder. Although the configuration thereof is not particularly limited, it is generally preferred that the aluminum nitride molding 1 be in the form of a sheet having scrap zones 4 around its outer periphery and positioned within the region between chips to be cut.

The aluminum nitride molding is furnished with at least one through-hole 2 for via hole formation. At least one of the through-holes 2 for via hole formation is provided in such a highly isolated state that, therearound, other through-holes for via hole formation are not densely present. As aforementioned, when an aluminum nitride molding 1 having highly isolated through-holes 2 for via hole formation is fired, the influence of a shrinkage factor difference between conductive portions and sintered portions of aluminum nitride is so high that a sintering balance would be deteriorated with the result that poor densification of via holes, or poor appearance such as cracking attributed thereto would be likely to occur. Therefore, the effect of the present invention can be favorably attained by using the above aluminum nitride molding as an object to be wrought.

In the present invention, the above problems of the prior art are solved by furnishing the aluminum nitride molding 1 with the through-holes 2 for via hole formation and the through-holes 3 for formation of dummy via holes not used for electrical connection so that the through-holes 2 for via hole formation having been filled with the conductive paste and the aluminum nitride molding respectively exhibit a firing shrinkage factor (Xv, %) and a firing shrinkage factor (Xs, %) whose difference, Xv–Xs, is in the range of –4.0 to 9.5%, preferably 1.0 to 5.5%, and still preferably 1.7 to 4.5%.

The conductive paste which is filled in the through-holes 2 contains the refractory metal as described later. When the refractory metal is buried in the aluminum nitride molding, while the firing shrinkage factor (Xs) of aluminum nitride molding is substantially not varied by an increase or a decrease of the content of refractory metal, the firing shrinkage factor (Xv) of through-holes 2 for via hole formation becomes approximately equal to or greater than the value of Xs in accordance with the increase of the content of buried refractory metal. On the other hand, when the content of buried refractory metal is decreased, the value of Xv becomes smaller than the value of Xs. Xs and Xv are not necessarily to be equal, and there would be no problem as long as they are balanced so as to fall within certain limits. However, when the difference of firing shrinkage factor, Xv–Xs, is less than –1.0%, there would occur poor densification of via holes, or, attributed thereto, cracking of internal conductive layers and poor appearance. On the other hand, when the difference of firing shrinkage factor exceeds 9.5%, there would occur cracking of sintered portions of aluminum nitride.

Therefore, in the present invention, in order to eliminate the influence of the shrinkage factor difference between conductive portions and sintered portions of aluminum nitride, the aluminum nitride molding is furnished with not only the through-holes 2 for via hole formation but also the through-holes 3 for formation of dummy via holes not used for electrical connection to thereby appropriately regulate the values of (Xv) and (Xs).

With respect to the firing shrinkage factor (Xv, %) of through-hole for via hole formation having been filled with the conductive paste, it is defined by the formula:

$$Xv(\%)=(1-Ra/Rb)\times 100$$

wherein Ra represents the diameter of via hole measured after being polished to a mirror-like surface of sintered aluminum nitride, and Rb represents the diameter of a punching metal mold employed for forming the through-hole for via hole formation.

The firing shrinkage factor (Xs, %) of aluminum nitride molding is defined by the formula:

$$Xs(\%)=(1-La/Lb)\times 100$$

wherein La represents the center distance of the remotest two via holes opposite to each other, with at least part of the via hole for Xv determination interposed therebetween. The two via holes are selected from the dummy via holes and other via holes which are present around the via hole formed from the via hole formation through-hole for determination of firing shrinkage factor (Xv), i.e., within a radius of 5.0 mm from the center of via hole formation through-hole as described below. The La is measured after polishing to form a mirror-like finish on the sintered aluminum nitride. The Lb measurement is made in the same manner as the La measurement but is made on the unfired aluminum nitride molding prior to sintering. When only one dummy via hole is formed or when any two selected from among dummy via holes and other via holes are not in such a positional relationship that they are opposite to each other with the via hole for (Xv) determination interposed therebetween, the distance corresponding to the above center distance can be determined by effecting marking by, for example, dimple or through-hole formation at a position close to the periphery around the above via hole on an extension line passing through the center of the remotest via hole among these other via holes and dummy via holes and the center of via hole for (Xv) determination.

When the through-hole for via hole formation is in such a highly isolated state that, therearound, other through-holes for via hole formation are not densely present, at least one through-hole for dummy via hole formation is formed around the highly isolated through-hole for via hole formation in order to regulate the firing shrinkage factor (Xv) of via hole formation through-hole and the firing shrinkage factor (Xs) of aluminum nitride molding.

Herein, the terminology "around the through-hole for via hole formation" means a portion of aluminum nitride molding which lies within a radius of 5.0 mm from the center of this through-hole. Even if other through-holes for via hole formation are formed beyond a radius of 5.0 mm from the center of this through-hole, they would exert substantially no influence on the sinterability of this through-hole for via hole formation.

Further, the expression "the through-hole for via hole formation is in such a state that, therearound, other through-holes for via hole formation are not densely present", i.e., "the through-hole for via hole formation is in a highly isolated state" means that the sum of the volumes of other through-holes for via hole formation which are present around the above through-hole is generally 0.9% or less, more specifically 0.5% or less, of the whole volume therearound. Of course, the highly isolated through-hole for via hole formation can be one around which there is absolutely no other through-hole for via hole formation.

With respect to other through-holes for via hole formation which are present across the boundary of the region around the highly isolated through-hole, only the volumes of via hole portions lying within the region are included in the sum.

The resolution of poor densification of via holes after sintering, or the resolution of the problem of poor appearance such as cracking attributed thereto, can be promoted in accordance with the formation of other through-holes for via hole formation around the highly isolated through-hole for via hole formation more densely than the above formation amount.

In the present invention, although the size of through-holes for via hole formation formed in the aluminum nitride molding is not particularly limited, it is generally preferred that the diameter thereof be in the range of 0.03 to 0.5 mm, especially 0.05 to 0.4 mm. With respect to the through-holes, the ratio of length to diameter (length/diameter) is preferably 40 or less.

The most remarkable characteristic of the present invention resides in that, in the production of a substrate of sintered aluminum nitride from the aluminum nitride molding having highly isolated through-holes 2 for via hole formation, at least one through-hole 3 for formation of dummy via holes not used for electrical connection on the substrate after firing is formed around each of the highly isolated through-holes 2 for via hole formation.

By virtue of the formation of through-holes for dummy via hole formation, the highly isolated through-hole for via hole formation can be converted to the through-hole around which through-holes for dummy via hole formation and other through-holes for via hole formation are densely present. As a result, with respect to the sintered aluminum nitride obtained by filling these through-holes with the conductive paste and performing a firing, the poor densification of via holes and the problem of poor appearance are greatly resolved.

With respect to the amount of through-holes for dummy via hole formation formed around the highly isolated through-hole for via hole formation, it is preferred that, within a radius of 5.0 mm from the center of the highly isolated through-hole for via hole formation, the volumes of through-holes for dummy via hole formation and other through-holes for via hole formation sum into 1 to 6%, especially 1.2 to 4%, of a whole volume within the radius. The formation of through-holes for dummy via hole formation in the above amount enables satisfactorily suppressing problems attributed to poor densification of via holes, such as cracking and other appearance deterioration, drop of the positional accuracy of via holes and the warp or deformation of sintered aluminum nitride.

In the present invention, the locality for disposing through-holes for dummy via hole formation is not particularly limited as long as it is around the highly isolated through-hole for via hole formation. The through-holes for dummy via hole formation can appropriately be disposed at positions exerting no influence on the electrical connection of semiconductor circuits arranged on the sintered aluminum nitride. It is preferred that the through-holes for dummy via hole formation be disposed around the highly isolated through-hole for via hole formation in a nonlocalized manner. In particular, it is preferred that at least either of through-hole for dummy via hole formation and other through-hole for via hole formation be disposed on each of radii dividing the region around the highly isolated through-hole for via hole formation into four parts.

With respect to the size of through-holes for dummy via hole formation and the ratio of through-hole length to diameter (length/diameter), it is preferred that the same range as mentioned above with respect to the through-holes for via hole formation be employed.

The sintered aluminum nitride produced by the present invention, when used as a substrate for semiconductor mounting, is generally cut into a plurality of small chips in rectangular or other form. At that time, the periphery of sintered aluminum nitride and partition zones between neighboring small chips are cut off or otherwise machined for scrapping. Therefore, in the present invention, it is preferred that the through-holes for dummy via hole formation be disposed in the scrap zones 4 (zones to be scrapped) of sintered aluminum nitride, positioned within the region around the highly isolated through-hole for via hole formation.

When the sintered aluminum nitride is in the form of a sheet, the scrap zones 4 are generally provided as a sheet periphery and a partition zone between small chips cut out, each having a width of 0.3 to 2 mm.

Figure 2:
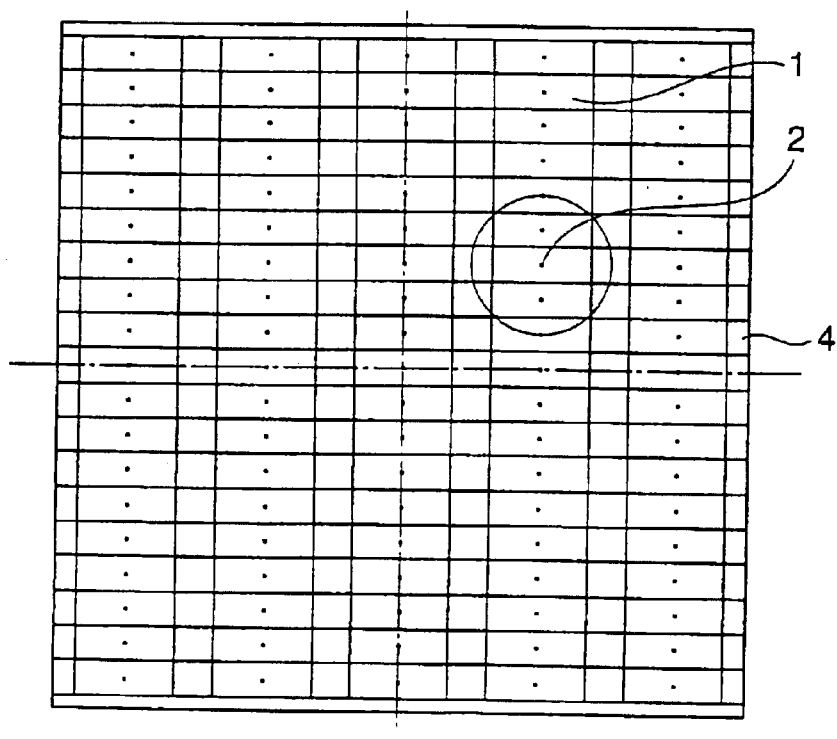
FIG. 2 is a plan of an aluminum nitride molding furnished with through-holes for via hole formation according to prior art.

The method of furnishing the aluminum nitride molding with through-holes for dummy via hole formation will now be described in detail with reference to FIG. 2 showing the aluminum nitride molding furnished with through-holes 2 for via hole formation according to the prior art and FIG. 1 showing the aluminum nitride molding of FIG. 2 further furnished with through-holes 3 for dummy via hole formation according to the present invention. Referring to FIG. 2, the aluminum nitride molding 1 is fired into the sintered aluminum nitride, from which a multiplicity of rectangular small chips are cut out as shown by partition lines, hi the aluminum nitride molding 1, through-hole 2 for formation of a via hole used for electrical connection of both major surfaces of a substrate is disposed in the center of each small chip partitioned. Each through-hole 2 for via hole formation is in such a highly isolated state that, within a radius of 5.0 mm from the through-hole center (within dotted line circle), other through-holes for via hole formation are only present in the aforementioned amount. When the conventional aluminum nitride molding 1 of FIG. 2 is fired, the sintered aluminum nitride would be likely to suffer from, as aforementioned, poor densification of via holes and hence problems of cracking and a drop of the positional accuracy of via holes would result.

By contrast, FIG. 1 shows the aluminum nitride molding 1 further furnished with through-holes for dummy via hole formation according to the present invention. Through-holes 3 for formation of dummy via holes not used for electrical connection are disposed around through-holes 2 for via hole formation. It is preferred that the formation amount thereof fall within the aforementioned range. Further, the through-holes 3 for dummy via hole formation are disposed in the locality corresponding to scrap zone 4 of the sintered aluminum nitride. The sintered aluminum nitride obtained by furnishing the aluminum nitride molding with through-holes for dummy via hole formation and firing the same is one with which the aforementioned problems have been resolved greatly.

In the present invention, the aluminum nitride powder for constituting the aluminum nitride molding is not particularly limited, and a known powder can be used. In particular, aluminum nitride powder of 5 $\mu$m or less average particle diameter is preferred, aluminum nitride powder of 0.3 $\mu$m or less average particle diameter is still more preferred, and aluminum nitride powder of 0.5 to 2 $\mu$m average particle diameter Is especially preferred, the average particle diameter measured by the sedimentation method. Moreover, the aluminum nitride powder having an average particle diameter D1 as calculated from the specific surface area thereof and an average particle diameter D2 as measured by the sedimentation method which satisfy the following formulas, $$0.2\ \mu m \leq D1 \leq 1.5\ \mu m,$$

and $$D2/D1 \leq 2.60$$

is suitable. This aluminum nitride powder is suitable because the linear shrinkage factor thereof at the time of firing can be reduced to thereby enhance the dimensional stability of sintered product and also can be made close to that of the conductive paste to thereby enable further increasing the adhesion strength between the sintered aluminum nitride and the conductive portions fitted in via holes.

In the aluminum nitride powder, the oxygen content is 3.0% by weight or less, and, when the aluminum nitride composition is AlN, the content of cationic impurities is 0.5% by weight or less. It is especially preferred to employ an aluminum nitride powder wherein the oxygen content is in the range of 0.4 to 1.0% by weight, the content of cationic impurities 0.2% by weight or less, and the total content of Fe, Ca, Si and C among cationic impurities 0.17% by weight or less. When this aluminum nitride powder is employed, the resulting sintered aluminum nitride exhibits a greatly increased thermal conductivity.

Known sintering aids can be used in the present invention without any particularly imitation. For example, alkaline earth metal compounds, such as calcium oxide and other oxides, and compounds of yttrium or lanthanide element, such as yttrium oxide and other oxides, can be preferably used.

Further, known organic binders can be used in the present invention without any particular limitation. For example, use can be made of an acrylic resin such as a polyacrylic ester or a polymethacrylic ester; a cellulose resin such as methylcellulose, hydroxymethylcellulose, nitrocellulose or cellulose acetate butylate; a resin containing a vinyl group such as polyvinyl butyral, polyvinyl alcohol or polyvinyl chloride; a hydrocarbon resin such as a polyolefin; and an oxygenic resin such as polyethylene oxide. These can be used individually or in combination. Among these, an acrylic resin can preferably be used because its degreasability is so high that the resistance of conductive portion fitted in via holes can be lowered. Furthermore, known solvents, dispersants, plasticizers and other components can be used without any particular limitation.

In the present invention, the above components for constituting the aluminum nitride molding can be blended at known ratios without any particular limitation. For example, 0.01 to 10 parts by weight of a sintering aid and 0.1 to 30 parts by weight of an organic binder can preferably be added per 100 parts by weight of aluminum nitride powder. In particular, adding 2 to 7 parts by weight of a sintering aid is advantageous from the viewpoint of an increase of thermal conductivity.

Although the method of preparing the aluminum nitride molding from these components is not particularly limited, generally, the components as molding materials are charged into a metal mold and compression molded into a press molding. Alternatively, the components are formed into green sheets by the doctor blade technique. The green sheets may be used individually or may be combined for use in the form of a laminate.

In the present invention, the method of furnishing the aluminum nitride molding with through-holes for via hole formation and through-holes for dummy via hole formation is not particularly limited, and, for example, generally used punching, drilling or laser processing can be employed without any particular limitation.

The thus formed through-holes for via hole formation and through-holes for dummy via hole formation are filled with a conductive paste obtained by mixing a refractory metal powder and an organic vehicle into a paste.

The refractory metal powder can be used without any particular limitation as long as its melting point is higher than the sintering temperature of aluminum nitride. For example, a metal such as tungsten or molybdenum can preferably be used as the refractory metal. The generally preferably employed refractory metal powder has an average particle diameter, measured by the Fischer's method, of 1 to 2.5 $\mu$m. The refractory metal powder having an average particle diameter of 1.6 to 2 $\mu$m is optimum because via hole cracking after firing is effectively prevented.

The organic vehicle component for forming the refractory metal powder into a paste is not particularly limited, and known one can be used. Generally, the organic vehicle component is composed of a binder and a solvent. Further, a plasticizer and a dispersant may be added thereto. The binder component is not particularly limited, but preferably used are organic binders, for example, an acrylic resin such as a polyacrylate or a polymethacrylate; a cellulose resin such as methylcellulose, ethylcellulose, hydroxymethylcellulose, nitrocellulose or cellulose acetate butylate; a resin containing a vinyl group such as polyvinyl butyral, polyvinyl alcohol or polyvinyl chloride; a hydrocarbon resin such as a polyolefin; and polyethylene oxide.

As the solvent component, solvents widely known as being useful in forming a metallizing composition into a paste can be employed without limitation. In particular, an organic solvent, such as di-n-butyl phthalate, diethylene glycolmono-n-hexyl ether, 2-(2-butoxyethoxy) ethyl acetate or terpineol, can preferably be used.

It is generally preferred that the organic vehicle component be added in an amount of 2 to 9 parts by weight per 100 parts by weight of the refractory metal powder. When the amount of organic vehicle is less than 2 parts by weight, the inorganic substance powder cannot be satisfactorily dispersed and forming the same into a paste is difficult, so that the filling property would be deteriorated. On the other hand, when the amount of organic vehicle is greater than 9 parts by weight, the inorganic substance concentration of the conductive paste becomes relatively low causing the unfavorable occurrence of poor densification of the via holes.

In the present invention, the conductive paste preferably contains an aluminum nitride powder. The aluminum nitride powder is effective in enhancing the sinterability of the refractory metal and enhancing the adherence thereof to the sintered aluminum nitride molding 1. Further, by virtue of the presence of the aluminum nitride powder in the conductive paste, the difference in the shrinkage factor between the aluminum nitride portion and conductive portion is reduced to thereby enhance the dimensional stability of sintered product in order that the object of the present invention can be more favorably attained.

With respect to the aluminum nitride powder, a known powder can be used without any particular limitation. In particular, the aforementioned aluminum nitride powder preferably used in the aluminum nitride molding is excellent in the sinterability with the refractory metal and is effective in enhancing the adherence of the conductive portion. The aluminum nitride powder is generally added in an amount of 2 to 10 parts by weight, preferably 3 to 7 parts by weight, per 100 parts by weight of the refractory metal powder.

In the conductive paste composition, when the amount of aluminum nitride is less than 2 parts by weight, the adhesion strength between the conductive portion and the sintered aluminum nitride tends to decrease, or the shrinkage factor difference between the sintered aluminum nitride portion and the conductive portion tends to increase, so that the danger of void occurrence at a junction interface would be high. On the other hand, when the amount of aluminum nitride is greater than 10 parts by weight, the viscosity of the conductive paste tends to increase so as to suffer deterioration of the filling property. As a result, the adhesion strength between the conductive portion and the sintered aluminum nitride tends to be decreased by voids occurring in the conductive portion, or the surface of the conductive portion tends to be discolored by the aluminum nitride, to thereby invite the danger of an increase of electrical resistance of the via holes. Moreover, in the event that voids have occurred at the junction interface or in the conductive portion as mentioned above, a gas or liquid would be trapped in the voids in the process of thin film formation with the result that a film detachment by expansion of gas or liquid, or a drop of film adhesion strength by dirt sticking to the surface of sintered product would tend to occur.

The method of mixing and dispersing these raw materials into a paste, although not particularly limited, is generally preferably accomplished by the use of, for example, a triple roll mill. It is generally preferred that the final viscosity of conductive paste be in the range of 100 to 30,000 poises as measured at 25° C./5 rpm.

As the means for filling the through-holes for via hole formation and the through-holes for dummy via hole formation with the conductive paste, known methods such as the printing method and the pressurized penetration method can be employed without any limitation. When the ratio of through-hole length to diameter (length/diameter) is greater than 2.5, the pressurized penetration method is preferably employed.

The firing of the thus obtained aluminum nitride molding having the through-holes for via hole formation and the through-holes for dummy via hole formation with the conductive paste can be accomplished by the use of known methods without any particular limitation. Prior to the firing, dewaxing is preferably effected as preliminary firing.

With respect to the method of dewaxing, generally performed methods can be employed without limitation. The dewaxing atmosphere is not particularly limited as long as an oxidative atmosphere such as atmospheric air which might oxidize the refractory metal is avoided. For example, there can preferably be employed an atmosphere of an inert gas such as nitrogen, argon or helium; an atmosphere of a reducing gas such as hydrogen; an atmosphere of a gas consisting of a mixture thereof; an atmosphere of a gas thereof which has been humidified; or a vacuum.

The temperature to be employed in the dewaxing, although it can appropriately be selected, is generally in the range of 500 to 1200° C., preferably 700 to 900° C. The heating rate to reach this temperature, although not particularly limited, is generally preferred to be not greater than 10° C./min.

Further, the dewaxing time can be so set that the residual carbon ratio of aluminum nitride molding after dewaxing is in the range of 800 to 3000 ppm. Although the dewaxing time is slightly varied depending on the thickness of molding, the density of molding, the proportion of via holes and dummy via holes, the dewaxing temperature, etc. and hence cannot be specified unconditionally, it is generally determined within the range of 1 to 600 min.

For satisfactorily promoting the densification of sintered aluminum nitride, the residual carbon ratio of aluminum nitride molding after dewaxing is generally 700 ppm or less. However, when it is intended to obtain the sintered aluminum nitride of high thermal conductivity, dewaxing should be effected so that the residual carbon ratio falls within the range of 800 to 3000 ppm, preferably 1200 to 2500 ppm.

When the residual carbon ratio of aluminum nitride molding is less than 800 ppm, the thermal conductivity of sintered aluminum nitride would not be satisfactorily high. On the other hand, when the residual carbon ratio exceeds 3000 ppm, the sinterability of the refractory metal powder would become so low that it would be difficult to satisfactorily promote the densification of via holes. Thus, the problems of cracking and drop of the positional accuracy of via holes are likely to occur. Further, cracking of the sintered portion of aluminum nitride and an increase of warp of sintered aluminum nitride would occur with the result that it would be difficult to satisfactorily attain the object of the present invention.

In the firing of the present invention, known methods can be employed without any particular limitation. The firing is generally performed in a nonoxidative or reducing atmosphere. As the nonoxidative atmosphere, there can be used, for example, an atmosphere of a gas such as nitrogen, argon or helium in pure or mixed form or a vacuum (reduced pressure) atmosphere. As the reducing gas atmosphere, there can be used an atmosphere of hydrogen or a mixture of hydrogen and an inert gas, which is preferably satisfactorily dried. The sintering temperature, although not particularly limited, is generally in the range of 1400 to 2000° C. The rate of temperature rise is in the range of 1 to 40° C./min. The period during which the sintering temperature selected within the above range is maintained is generally in the range of 1 min to 20 hr.

In order to obtain sintered aluminum nitride of high thermal conductivity, it is desirable to fire the aluminum nitride molding after it has been dewaxed so that the residual carbon ratio of the aluminum nitride molding falls within the range of 800 to 3000 ppm (hereinafter referred to simply as "dewaxed material") at 1200 to 1700° C., preferably 1500 to 1650° C., and thereafter 1800 to 1950° C., preferably 1820 to 1900° C. When dewaxing is performed so as to ensure a high residual carbon ratio, the resultant sintered aluminum nitride is generally likely to suffer from the problems of poor densification of via holes and poor appearance such as cracking, while the above high thermal conductivity can be ensured.

When the first-step firing temperature is lower than 1200° C., it would be difficult to promote the reaction for removing oxygen contained in the aluminum nitride by reduction with carbon remaining in the dewaxed material, thereby disenabling satisfactorily increasing the thermal conductivity of sintered aluminum nitride. On the other hand, when the first-step firing temperature exceeds 1700° C., the sintering of aluminum nitride would be highly advanced before satisfactory advance of the reaction for removing oxygen contained in the aluminum nitride by reduction with remaining carbon, so that the diffusion and solid dissolution of oxygen in the aluminum nitride would occur to thereby inhibit the increase of thermal conductivity of sintered aluminum nitride.

It is preferred that the first-step firing temperature range from 1500 to 1650° C. from the viewpoint that the oxygen removing reaction by reduction can be promoted with especially high efficiency so as to increase the thermal conductivity of the sintered aluminum nitride. When the second-step firing temperature is lower than 1800° C., it would not be feasible to satisfactorily sinter the aluminum nitride. As the result, it would not be feasible to satisfactorily increase the thermal conductivity of the sintered aluminum nitride.

On the other hand, when the second-step firing temperature exceeds 1950° C., not only would the adhesion strength between via holes and the sintered aluminum nitride be lowered, but also, failures such as the warp or deformation of the sintered aluminum nitride would tend to occur.

In the above two-step firing, the period during which each firing temperature is maintained, although not particularly limited, is preferably set within the range of 30 min to 10 hr in the first step, and within the range of 1 min to 20 hr in the second step. In the first-step and second-step firings, one continuous firing operation may be carried out without cooling therebetween, or two separate firing operations may be carried out with cooling therebetween. From the viewpoint of required time and energy efficiency, one continuous firing operation performed without cooling therebetween is preferred.

The most appropriate working mode for carrying out the present invention comprises using, as the conductive paste, a composition comprising 100 parts by weight of the refractory metal, 2 to 10 parts by weight of aluminum nitride powder and 2 to 9 parts by weight of an organic vehicle; dewaxing the aluminum nitride molding so that the residual carbon ratio of the aluminum nitride molding falls within the range of 800 to 3000 ppm; and performing the first-step firing at 1200 to 1700° C. and the second-step firing at 1800 to 1950° C.

According to the co-firing method in which the above two-step firing is performed, a sintered substrate having a high thermal conductivity such as 190 W/m·K or greater can be produced (Japanese Patent Laid-open Publication No. 2000-290748), whilst only a sintered aluminum nitride substrate of about 170 W/m·K thermal conductivity at 25° C. can be obtained according to the prior art. However, with respect to the obtained sintered substrate, the problem of poor appearance such as cracking due to the poor densification of via holes is extremely serious, which problem is attributed to the residual carbon ratio falling within a specified high range as mentioned above. By contrast, even when this two-step firing is employed, the providing of through-holes for dummy via hole formation so as to satisfy given requirements according to the present invention enables producing the sintered aluminum nitride which, while having an extremely high thermal conductivity, is free from the problems of poor appearance such as cracking attributed to poor densification of via holes, drop of the positional accuracy of via holes and failure such as warp or deformation.

The sintered aluminum nitride furnished with via holes, obtained by the present invention, is generally subjected to metallization of its surface for forming a thin film before practical use. For example, when it is intended to form a thin film on the surface, the surface of sintered product is preferably polished for increasing the adhesion strength between thin film and sintered product. It is generally preferred that the polishing be performed so that the surface roughness (Ra) of sintered aluminum nitride portion after polishing is 1.0 μm or less, especially 0.1 μm or less.

In the formation of a thin film, known methods can be used without any limitation. For example, there can be appropriately employed the sputtering method, vapor deposition method, flame spraying method or sol/gel coating method wherein a spin coating or dipping technique is applied. The raw material of the thin film can be, for example, any of common conductor metals for circuit such as Ti, Zr, Pd, Pt, Au, Cu and Ni; resistors such as TaN; solders such as Pb—Sn, Au—Sn and Au—Ge; and aluminum nitride or mullite composition (including composite oxide).

Furthermore, the formed thin film can be patterned into the desired morphology. In the patterning, known techniques such as the metal mask method, wet etching method, liftoff method and dry etching method can be employed without any particular limitation. In the present invention, the dummy via holes obtained by sintering the through-holes for dummy via hole formation are disposed at a locality not brought into contact with the above thin film pattern and are not used for electrical connection of two surfaces opposite to each other.

The sintered aluminum nitride after the above metallization is subjected to machining operations such as grinding and cutting to thereby effect removal of scrap zones, parting into small chips and other forming work. When the dummy via holes are formed in the scrap zones, the dummy via holes can favorably be removed from the substrate by the above machining.

As apparent from the above description, in the process for producing a sintered aluminum nitride furnished with via holes according to the co-firing method, the present invention enables satisfactorily suppressing the poor appearance such as cracking of conductive portions attributed to poor densification, drop of the positional accuracy of via holes and other failures, even if there are highly isolated through-holes for via hole formation. Accordingly, the present invention enables obtaining the above sintered aluminum nitride with high yield. Therefore, its industrial value is great.

The sintered aluminum nitride furnished with via holes according to the present invention, after being subjected to a thin film metallization on its surface, can be appropriately used in electronic/semiconductor device parts such as a laser diode submount or chip carrier, a heat sink and an IC package.

EXAMPLE

The present invention will be further illustrated below with reference to the following Examples, which in no way limit the scope of the invention.

In the following Examples and Comparative Examples, the properties were measured in the following manner.

(1) Residual carbon ratio of aluminum nitride molding

The residual carbon ratio was analyzed by means of nondiffusion-type infrared absorption carbon analyzer (model EMIA-110, manufactured by Horiba Seisakusho Co., Ltd.).

(2) Average particle diameter of aluminum nitride powder

The average particle diameter D1 from a specific surface area was calculated by the formula:

$$D1\ (\mu m)=6/(S\times 3.26)$$

wherein S represents the specific surface area (m$^2$/g) of AlN powder.

The average particle diameter D2 according to the sedimentation method was measured by means of centrifugal particle size distribution measuring apparatus (model CAPA 5000, manufactured by Horiba Seisakusho Co., Ltd.).

(3) "(Xv)–(Xs)"

3-1) Firing shrinkage factor (Xv, %) of through-hole for via hole formation

On a sintered aluminum nitride after being polished like a mirror surface, five via holes were randomly selected, and the diameters thereof were measured and averaged to thereby obtain an average diameter Ra. The firing shrinkage factor was calculated by the formula:

$$Xv(\%)=(1-Ra/Rb)\times 100$$

wherein Ra represents an average of the diameters of five via holes measured on a sintered aluminum nitride after being polished to a mirror-like surface, and Rb represents the diameter of a punching metal mold employed for forming the through-holes for via hole formation.

3-2) Firing shrinkage factor (Xs, %) of aluminum nitride molding

With respect to each of the through-holes of aluminum nitride molding for formation of five via holes selected in the above measurement of firing shrinkage factor (Xv), the center distance of two via holes of remotest positional relationship opposite to each other, with at least part of the above through-hole for via hole formation interposed therebetween was measured by the use of a measure scope. The two via holes are selected from the other through-holes via hole formation and through-holes for dummy via hole formation which were present within a radius of 5.0 mm from the center of the through hole for via hole formation used for measurement of (Xv). The measured center distances were averaged, and designated Lb. Moreover, with respect to the sintered product from the aluminum nitride molding, after being polished like a mirror surface, the center distances between two via holes derived from the other through-holes for via hole formation and through-holes for dummy via hole formation used for measuring the above average Lb were measured. The measured center distances were averaged, and designated La.

Using the thus determined La and Lb, the firing shrikage factor of aluminum nitride molding was calculated by the formula:

$$Xs(\%)=(1-La/Lb)\times 100.$$

(4) Conductive layer cracking ratio of via hole

Sintered aluminum nitride, after polish like a mirror surface, was observed through a metallurgical microscope (×400), and the number of via holes having cracks of 12.5 μm or more length was counted. The cracking ratio was calculated therefrom.

(5) Heat resistance of metallic thin film formed on surface

Sintered aluminum nitride was subjected to polishing to produce a mirror-like surface. In a high vacuum of $10^{-3}$ torr, 0.06 μm thick Ti, 0.2 μm thick Pt and 0.6 μm thick Au metallic thin films were sequentially formed on the surface by sputtering. The resultant sintered aluminum nitride was allowed to stand still in the atmospheric air at 450° C. for 5 min, and the appearance thereof was observed by visual inspection and through a stereomicroscope (μ40). The appearance was evaluated on the following criteria:

A: neither discoloration nor blistering observed, and

B: at least either discoloration or blistering observed.

(6) Adhesion strength between via hole and metallic thin film

A solder preform was disposed on a sintered aluminum nitride coated with metallic thin film so as to cover the via holes, and a Ni plated pin was vertically soldered thereto on a hot plate heated at 230° C. The pin had a flat distal end and had a diameter of 0.95 mm, and was made of 42-alloy. The solder consisted of 60% by weight of tin and 40% by weight of lead. The obtained test piece was set in Strograph M2 manufactured by Toyo Seiki Seisakusho, Ltd., and the rupture strength exhibited when the pin was vertically pulled was measured. The pulling speed was 10 mm/min. The position of peel interface (peeling mode) and the rupture faces of pin and sintered aluminum nitride after testing were inspected by observation through a stereomicroscope (×40), a metallurgical microscope (×400) and an X-ray microanalyzer.

(7) Electrical resistance of via hole

Sintered aluminum nitride, after polishing to mirror-like surface, was cut and divided into small chips. Thereafter, the electrical resistance of via holes was measured.

(8) Warp of sintered aluminum nitride

The warp was measured by the use of micrometer with surface plate manufactured by Mitsutoyo Corporation.

Example 1

TABLE 1

| Analysis of AlN powder | |
|---|---|
| AlN content | 97.8% |
| Element | Content |
| Ca | 105 ppm |
| Si | 63 ppm |
| Fe | 12 ppm |
| Ti | 16 ppm |
| V | 0.8 ppm |
| O | 0.80% |
| C | 0.03% |

100 parts by weight of aluminum nitride powder of the composition of Table 1, having an average particle diameter, measured by the sedimentation method, of 1.50 μm and having a specific surface area of 2.50 m²/g (average particle diameter calculated from the specific surface area: 0.74 μm), 5 parts by weight of yttria, 2 parts by weight of n-butyl methacrylate as a dispersant, 11 parts by weight of polybutyl acrylate as an organic binder, 7 parts by weight of dioctyl phthalate as a plasticizer and 50 parts by weight of a mixed solvent consisting of toluene and isopropyl alcohol were weighed into a ball mill pot and satisfactorily milled with the use of nylon balls. The thus obtained slurry was introduced into a defoaming machine, thereby obtaining a slurry having a viscosity of 20,000 cps. The slurry was sheeted on a polypropylene film by the use of a doctor blade type sheeting machine. Thus, a green sheet of aluminum nitride having a thickness of about 0.50 mm was obtained.

The obtained green sheet of aluminum nitride was cut into 65×65 mm pieces. Subsequently, three pieces of the aluminum nitride green sheet were laminated together under such conditions that the pressure temperature and time were 50 kgf/cm², 80° C. and 15 min, respectively. This green sheet laminate was one which, when processed into a sintered aluminum nitride, cutting out of 95 rectangular small chips as shown in the diagrammatic view of FIG. 2 was planned.

The obtained 65×65 mm green sheet laminate was punched with a punching metal mold of 0.28 mm diameter so that 5-series of through-holes for via hole formation were formed at pitches of 10.0 mm in the X-direction and 19-series of through-holes for via hole formation at pitches of 2.5 mm in the Y-direction, the through-holes positioned at the centers of planned chips. With respect to each of the through-holes for via hole formation, the sum of the volumes of other through-holes for via hole formation which were present within a radius of 5.0 mm from the center of the above each through-hole (within dotted line circle) was 0.4% of the whole volume within the radius (hereinafter, this value referred to as "level of isolation of through-hole for via hole formation").

Further, a total of 630 through-holes for dummy via hole formation were formed with a punching metal mold of 0.36 mm diameter so as to be positioned within the above radii from the centers of through-holes for via hole formation. These through-holes for dummy via hole formation were all disposed on scrap zones 4 positioned at sheet periphery and partition areas between neighboring small chips. With respect to each of the through-holes for via hole formation, the sum of the volumes of through-holes for dummy via hole formation and other through-holes for via hole formation formed within the above radius was 2.7% of the whole volume within the above radius (hereinafter this value referred to as "amount of via hole through-holes+dummy via hole through-holes formed").

Thereafter, 100 parts by weight of tungsten powder having an average particle diameter, measured by the Fischer's method, of 1.8 μm, 5 parts by weight of the above aluminum nitride powder, 1.5 parts by weight of ethylcellulose as an organic binder and 5.0 parts by weight of 2-(2-butoxyethoxy) ethyl acetate as a solvent together with a plasticizer and a dispersant were satisfactorily milled by means of an automortar and then a triple roll mill, thereby obtaining a conductive paste. This conductive paste was charged in the through-holes for via hole formation and through-holes for dummy via hole formation of the green sheet laminate by the pressurized penetration method. The charging pressure and time were 80 psi and 310 sec, respectively.

The thus obtained aluminum nitride molding was dewaxed by heating the same at 900° C. for 2 hr in a dry nitrogen gas flowing at 25 lit./min. The temperature was raised thereto at 2.5° C./min. With respect to a test sample of the aluminum nitride molding after dewaxed by heating, the residual carbon ratio thereof was measured. It was 1850 ppm. The dewaxed aluminum nitride molding was placed in an aluminum nitride vessel, heated in nitrogen atmosphere at 1580° C. for 6 hr (first-step firing) and further heated in nitrogen atmosphere at 1870° C. for 10 hr (second-step firing). Thus, a sintered aluminum nitride was obtained.

The properties of the obtained sintered aluminum nitride are listed in Table 4.

Small chips having no dummy via holes were obtained by cutting off the scrap zones 4 from the sintered aluminum nitride.

Examples 2 to 5

Comparative Examples 1 to 3

The same procedure as in Example 1 was repeated except that "the level of isolation of through-holes for via hole formation" and "the amount of through-holes for dummy via hole formation formed" were changed as specified in Table 2 by changing the diameter, pitches and total of punched through-holes at the punching of through-holes for via hole formation and through-holes for dummy via hole formation.

The properties of each of the obtained sintered aluminum nitrides are listed in Table 4.

Examples 6 to 8

The same procedure as in Example 1 was repeated except that the addition amount of aluminum nitride powder to the conductive paste was changed as shown in Table 2.

The properties of each of the obtained sintered aluminum nitrides are listed in Table 4.

Examples 9 to 11

The same procedure as in Example 1 was repeated except that the addition amount of organic vehicle to the conductive paste was changed as shown in Tables 2 and 3.

The properties of each of the obtained sintered aluminum nitrides are listed in Tables 4 and 5.

Example 12

The aluminum nitride molding as prepared in Example 1 was dewaxed by heating the same at 900° C. for 2 hr in a dry nitrogen/hydrogen mixed gas flowing at 30 lit./min. The temperature was raised thereto at 2.5° C./min. With respect to a test sample of the aluminum nitride molding after dewaxing by heating, the residual carbon ratio thereof was measured. It was 810 ppm. The dewaxed aluminum nitride molding was placed in an aluminum nitride vessel, heated in nitrogen atmosphere at 1580° C. for 6 hr (first-step firing) and further heated in nitrogen atmosphere at 1870° C. for 10 hr (second-step firing). Thus, a sintered aluminum nitride was obtained.

The properties of the obtained sintered aluminum nitride are listed in Table 5.

Example 13

The aluminum nitride molding as prepared in Example 1 was dewaxed by heating the same at 900° C. for 2 hr in a dry nitrogen gas flowing at 37 lit./min. The temperature was raised thereto at 2.5° C./min. With respect to a test sample of the aluminum nitride molding after dewaxing by heating, the residual carbon ratio thereof was measured. It was 1300 ppm.

The dewaxed aluminum nitride molding was placed in an aluminum nitride vessel, heated in nitrogen atmosphere at 1580° C. for 6 hr (first-step firing) and further heated in nitrogen atmosphere at 1870° C. for 10 hr (second-step firing). Thus, a sintered aluminum nitride was obtained.

The properties of the obtained sintered aluminum nitride are listed in Table 5.

Example 14

The aluminum nitride molding as prepared in Example 1 was dewaxed by heating the same at 900° C. for 2 hr in a dry nitrogen gas flowing at 30 lit./min. The temperature was raised thereto at 2.5° C./min. With respect to a test sample of the aluminum nitride molding after dewaxing by heating, the residual carbon ratio thereof was measured. It was 2210 ppm. The dewaxed aluminum nitride molding was placed in an aluminum nitride vessel, heated in nitrogen atmosphere at 1580° C. for 6 hr (first-step firing) and further heated in nitrogen atmosphere at 1870° C. for 10 hr (second-step firing). Thus, a sintered aluminum nitride was obtained.

The properties of the obtained sintered aluminum nitride are listed in Table 5.

Example 15

The aluminum nitride molding as prepared in Example 1 was dewaxed by heating the same at 900° C. for 2 hr in a dry nitrogen gas flowing at 18 lit./min. The temperature was raised thereto at 2.5° C./min. With respect to a test sample of the aluminum nitride molding after dewaxing by heating, the residual carbon ratio there of was measured. It was 2760 ppm.

The dewaxed aluminum nitride molding was placed in an aluminum nitride vessel, heated in nitrogen atmosphere at 1580° C. for 6 hr (first-step firing) and further heated in nitrogen atmosphere at 1870° C. for 10 hr (second-step firing). Thus, a sintered aluminum nitride was obtained.

The properties of the obtained sintered aluminum nitride are listed in Table 5.

Examples 16 to 18

The same procedure as in Example 1 was repeated except that the first-step firing temperature was changed as specified in Table 4.

The properties of each of the obtained sintered aluminum nitrides are listed in Table 5.

Examples 19 to 21

The same procedure as in Example 1 was repeated except that the second-step firing temperature was changed as specified in Table 4.

The properties of each of the obtained sintered aluminum nitrides are listed in Table 5.

TABLE 2

|  | Level of isolation of through hole for via hole formation (vol %) | Amount of via hole through hole + dummy via hole through hole formed (vol %) | Addition amount of AlN (parts by weight) | Amount of organic vehicle (parts by weight) | Residual carbon ratio (ppm) | Firing temp. (° C.) 1st step | Firing temp. (° C.) 2nd step |
|---|---|---|---|---|---|---|---|
| Example 1 | 0.4 | 2.7 | 5.0 | 7.0 | 1850 | 1580 | 1870 |
| Comp. Ex. 1 | 0.4 | 0.4 | 5.0 | 7.0 | 1130 | 1580 | 1870 |
| Example 2 | 0.4 | 1.2 | 5.0 | 7.0 | 1320 | 1580 | 1870 |
| Example 3 | 0.4 | 5.9 | 5.0 | 7.0 | 2800 | 1580 | 1870 |
| Example 4 | 0.2 | 3.4 | 5.0 | 7.0 | 2210 | 1580 | 1870 |
| Comp. Ex. 2 | 0.2 | 0.2 | 5.0 | 7.0 | 1050 | 1580 | 1870 |
| Example 5 | 0.8 | 4.0 | 5.0 | 7.0 | 2760 | 1580 | 1870 |
| Comp. Ex. 3 | 0.8 | 0.8 | 5.0 | 7.0 | 1250 | 1580 | 1870 |
| Example 6 | 0.4 | 2.7 | 2.5 | 7.0 | 1900 | 1580 | 1870 |
| Example 7 | 0.4 | 2.7 | 6.5 | 7.0 | 1800 | 1580 | 1870 |
| Example 8 | 0.4 | 2.7 | 8.5 | 7.0 | 1700 | 1580 | 1870 |
| Example 9 | 0.4 | 2.7 | 5.0 | 2.5 | 1780 | 1580 | 1870 |
| Example 10 | 0.4 | 2.7 | 5.0 | 4.5 | 1800 | 1580 | 1870 |

TABLE 3

|  | Level of isolation of through hole for via hole formation (vol %) | Amount of via hole through hole + dummy via hole through hole formed (vol %) | Addition amount of AlN (parts by weight) | Amount of organic vehicle (parts by weight) | Residual carbon ratio (ppm) | Firing temp. (° C.) 1st step | Firing temp. (° C.) 2nd step |
|---|---|---|---|---|---|---|---|
| Example 11 | 0.4 | 2.7 | 5.0 | 8.0 | 1950 | 1580 | 1870 |
| Example 12 | 0.4 | 2.7 | 5.0 | 7.0 | 810 | 1580 | 1870 |
| Example 13 | 0.4 | 2.7 | 5.0 | 7.0 | 1300 | 1580 | 1870 |
| Example 14 | 0.4 | 2.7 | 5.0 | 7.0 | 2210 | 1580 | 1870 |
| Example 15 | 0.4 | 2.7 | 5.0 | 7.0 | 2760 | 1580 | 1870 |
| Example 16 | 0.4 | 2.7 | 5.0 | 7.0 | 1850 | 1250 | 1870 |
| Example 17 | 0.4 | 2.7 | 5.0 | 7.0 | 1850 | 1500 | 1870 |
| Example 18 | 0.4 | 2.7 | 5.0 | 7.0 | 1850 | 1650 | 1870 |
| Example 19 | 0.4 | 2.7 | 5.0 | 7.0 | 1850 | 1580 | 1820 |
| Example 20 | 0.4 | 2.7 | 5.0 | 7.0 | 1850 | 1580 | 1900 |
| Example 21 | 0.4 | 2.7 | 5.0 | 7.0 | 1850 | 1580 | 1930 |

TABLE 4

|  | Warp of sintered product (μm) | Thermal conductivity of sintered product (W/mK) | Firing shrinkage factor of aluminum nitride molding (%) | Firing shrinkage factor of through hole for via hole formation (%) | Crack occurrence (%) | Adhesion strength between via hole and metal thin film (kg/mm²) | Peel mode | Electrical resistance of via hole (mΩ) | Heat resistance |
|---|---|---|---|---|---|---|---|---|---|
| Example 1 | 49 | 215 | 18.0 | 21.0 | 0 | 12.6 | in solder | 1.0 | A |
| Comp. Ex. 1 | 10 | 205 | 18.0 | 11.2 | 100 | 1.2 | via/film | 0.5 | B |
| Example 2 | 20 | 208 | 17.9 | 21.7 | 0 | 12.5 | in solder | 0.5 | A |
| Example 3 | 65 | 216 | 18.1 | 20.0 | 0 | 11.4 | in solder | 1.9 | A |
| Example 4 | 43 | 215 | 17.9 | 20.6 | 0 | 11.6 | in solder | 1.3 | A |
| Comp. Ex. 2 | 8 | 201 | 18.1 | 9.5 | 100 | 1.0 | via/film | 0.4 | B |
| Example 5 | 61 | 215 | 18.1 | 20.2 | 0 | 12.4 | in solder | 1.8 | A |
| Comp. Ex. 3 | 13 | 203 | 18.0 | 11.5 | 100 | 2.4 | via/film | 0.6 | B |
| Example 6 | 48 | 215 | 17.8 | 20.9 | 0 | 9.4 | in solder | 1.1 | A |
| Example 7 | 46 | 212 | 17.9 | 21.0 | 0 | 12.7 | in solder | 1.6 | A |
| Example 8 | 40 | 209 | 18.0 | 20.9 | 0 | 13.0 | in solder | 2.2 | A |
| Example 9 | 42 | 210 | 18.0 | 21.3 | 0 | 12.1 | in solder | 2.3 | A |
| Example 10 | 44 | 213 | 17.8 | 21.2 | 0 | 12.5 | in solder | 2.3 | A |

TABLE 5

|  | Warp of sintered product (μm) | Thermal conductivity of sintered product (W/mK) | Firing shrinkage factor of aluminum nitride molding (%) | Firing shrinkage factor of through hole for via hole formation (%) | Crack occurrence (%) | Adhesion strength between via hole and metal thin film (kg/mm²) | Peel mode | Electrical resistance of via hole (mΩ) | Heat resistance |
|---|---|---|---|---|---|---|---|---|---|
| Example 11 | 45 | 214 | 17.9 | 20.9 | 0 | 12.5 | in solder | 2.5 | A |
| Example 12 | 19 | 198 | 18.2 | 22.5 | 0 | 12.5 | in solder | 0.4 | A |
| Example 13 | 26 | 205 | 17.9 | 22.1 | 0 | 13.7 | in solder | 0.5 | A |
| Example 14 | 38 | 207 | 18.0 | 20.5 | 0 | 12.4 | in solder | 1.3 | A |
| Example 15 | 72 | 215 | 17.9 | 20.3 | 0 | 12.7 | in solder | 1.9 | A |
| Example 16 | 40 | 212 | 18.1 | 21.0 | 0 | 11.5 | in solder | 2.8 | A |
| Example 17 | 39 | 213 | 18.1 | 21.1 | 0 | 11.4 | in solder | 1.2 | A |
| Example 18 | 42 | 210 | 18.4 | 21.2 | 0 | 12.1 | in solder | 1.0 | A |
| Example 19 | 45 | 212 | 18.1 | 21.5 | 0 | 12.0 | in solder | 0.8 | A |
| Example 20 | 41 | 212 | 17.8 | 21.1 | 0 | 12.5 | in solder | 1.2 | A |
| Example 21 | 46 | 214 | 17.9 | 21.1 | 0 | 11.7 | in solder | 0.9 | A |
| Example 22 | 52 | 215 | 18.0 | 21.4 | 0 | 11.8 | in solder | 0.8 | A |

What is claimed is:

1. A process for producing a sintered aluminum nitride furnished with via holes, comprising providing an aluminum nitride molding having through-holes for via hole formation and through-holes for formation of dummy via holes not used for electrical connection, wherein the through-holes for formation of dummy via holes are distributed within the aluminum nitride molding, filling the through-holes for via hole formation and the through-holes for dummy via hole formation with a conductive paste and firing the aluminum nitride molding and conductive paste, wherein the aluminum nitride molding is furnished with the through-holes for via hole formation and the through-holes for dummy via hole formation so that the through-holes for via hole formation having been filled with the conductive paste and the aluminum nitride molding respectively exhibit a firing shrinkage factor of the through-hole for via hole formation (Xv, %) and a firing shrinkage factor of the aluminum nitride molding (Xs, %) whose difference, Xv–Xs, is in the range of –1.0 to 9.5%.

2. A process for producing a sintered aluminum nitride furnished with via holes, comprising providing an aluminum nitride molding having through-holes for via hole formation and through-holes for formation of dummy via holes not used for electrical connection, wherein the through-holes for formation of dummy via holes are distributed within the aluminum nitride molding, filling the through-holes for via hole formation and the through-holes for dummy via hole formation with a conductive paste and firing the aluminum nitride molding and conductive paste, wherein at least one of the through-holes for via hole formation is in a highly isolated state whereby the through-hole for via hole formation in said highly isolated state comprises the other through-holes for via hole formation and the through-holes for formation of dummy via holes, wherein at least one of the through-holes for formation of dummy via holes is formed around the through-hole for via hole formation in said highly isolated state, and wherein the through-hole for via hole formation in said highly isolated state has a volume of 0.9% or less of the other through-holes for via hole formation and a volume of 1–6% of the other through-holes for via hole formation and through-holes for formation of dummy via hole formation in an area of 5.0 mm radius from a center of the through-hole for via hole formation of said highly isolated state.

3. The process as claimed in claim 1, wherein through-holes for dummy via hole formation are formed in a scrap zone within the sintered aluminum nitride.

4. The process as claimed in claim 3, wherein, after the firing, the scrap zone is cut off from the sintered aluminum nitride.

5. The process as claimed in claim 1, wherein a composition comprising 100 parts by weight of a refractory metal, 2 to 10 parts by weight of powdery aluminum nitride and 2 to 9 parts by weight of an organic vehicle is used as the conductive paste.

6. The process as claimed in claim 5, wherein the aluminum nitride molding, after the filling of the through-holes for via hole formation and through-holes for dummy via hole formation with the conductive paste, is dewaxed so that the aluminum nitride molding exhibits an internal residual carbon ratio of 800 to 3000 ppm, then fired at 1200 to 1700° C. and further fired at 1800 to 1950° C.

7. The process as claimed in claim 2, wherein through-holes for dummy via hole formation are formed in a scrap zone within the sintered aluminum nitride.

8. The process as claimed in claim 7, wherein, after the firing, the scrap zone is cut off from the sintered aluminum nitride.

9. The process as claimed in claim 2, wherein a composition comprising 100 parts by weight of a refractory metal, 2 to 10 parts by weight of powdery aluminum nitride and 2 to 9 by weight of an organic vehicle is used as the conductive paste.

10. The process as claimed in claim 9, wherein the aluminum nitride molding, after the filling of the through-holes for via hole formation and through-holes for dummy via hole formation with the conductive paste, is dewaxed so that the aluminum nitride molding exhibits an internal residual carbon ratio of 800 to 3000 ppm, then fired at 1200 to 1700° C. and further fired at 1800 to 1950° C.

* * * * *

UNITED STATES PATENT AND TRADEMARK OFFICE
CERTIFICATE OF CORRECTION

PATENT NO. : 6,733,822 B2
DATED : May 11, 2004
INVENTOR(S) : Yamamoto et al.

It is certified that error appears in the above-identified patent and that said Letters Patent is hereby corrected as shown below:

Column 20,
Lines 55-56, "2 to 9 by weight" should read -- 2 to 9 parts by weight --.

Signed and Sealed this

Eighth Day of February, 2005

JON W. DUDAS
*Director of the United States Patent and Trademark Office*